United States Patent
Hoffmann et al.

(10) Patent No.: US 12,386,263 B2
(45) Date of Patent: Aug. 12, 2025

(54) REFLECTIVE OPTICAL ELEMENT, ILLUMINATION OPTICAL UNIT, PROJECTION EXPOSURE APPARATUS, AND METHOD FOR PRODUCING A PROTECTIVE LAYER

(71) Applicant: Carl Zeiss SMT GmbH, Oberkochen (DE)

(72) Inventors: Sandro Hoffmann, Aalen (DE); Valentin Jonatan Bolsinger, Aalen (DE); Sandra Haschke, Oberkochen (DE)

(73) Assignee: CARL ZEISS SMT GMBH, Oberkochen (DE)

(*) Notice: Subject to any disclaimer, the term of this patent is extended or adjusted under 35 U.S.C. 154(b) by 155 days.

(21) Appl. No.: 18/171,449

(22) Filed: Feb. 20, 2023

(65) Prior Publication Data
US 2023/0205090 A1 Jun. 29, 2023

Related U.S. Application Data

(63) Continuation of application No. PCT/EP2021/069248, filed on Jul. 12, 2021.

(30) Foreign Application Priority Data
Aug. 20, 2020 (DE) ............ 10 2020 210 553.7

(51) Int. Cl.
*G03F 7/20* (2006.01)
*G03F 7/00* (2006.01)

(52) U.S. Cl.
CPC ........ *G03F 7/2008* (2013.01); *G03F 7/70958* (2013.01); *G03F 7/70983* (2013.01)

(58) Field of Classification Search
CPC ............ G03F 7/70175; G03F 7/70191; G03F 7/70308; G03F 7/70958; G03F 7/70983;
(Continued)

(56) References Cited

U.S. PATENT DOCUMENTS 6,664,554 B2  12/2003  Klebanoff et al.
9,612,370 B1   4/2017  Johnson
(Continued)

FOREIGN PATENT DOCUMENTS

DE      10223113 A1  12/2003
DE  102008000990 B3  11/2009
(Continued)

OTHER PUBLICATIONS

International Search Report, PCT/EP2021/069248, Oct. 15, 2021, 5 pages.
(Continued)

*Primary Examiner* — Steven H Whitesell
(74) *Attorney, Agent, or Firm* — Edell, Shapiro & Finnan, LLC

(57) ABSTRACT

A reflective optical element (17), in particular for an illumination optical unit of a projection exposure apparatus includes: a structured surface (25a) that preferably forms a grating structure (29), and a reflective coating (36) that is applied to the structured surface (25a). The reflective coating (36) covers the structured surface (25a) discontinuously, and the reflective optical element (17) has at least one protective layer (37) that covers the structured surface (25a) continuously. Also disclosed are an illumination optical unit (4) for a projection exposure apparatus (1) including at least one reflective optical element (17) of this type, to a projection exposure apparatus (1) including an illumination optical
(Continued)

unit (4) of this type, and to a method for producing a protective layer (37) on a reflective optical element (17) of this type.

20 Claims, 3 Drawing Sheets

(58) Field of Classification Search
CPC .. G02B 5/0891; G02B 5/0858; G02B 5/1809; G02B 5/1861; G02B 5/1838
See application file for complete search history.

(56) References Cited

U.S. PATENT DOCUMENTS

| | | | |
|---|---|---|---|
| 2003/0039894 A1* | 2/2003 | Yan | G03F 1/24 430/323 |
| 2003/0232256 A1 | 12/2003 | Wurm et al. | |
| 2007/0125964 A1 | 6/2007 | Van Herpen et al. | |
| 2012/0147350 A1 | 6/2012 | Yakunin et al. | |
| 2014/0199543 A1 | 7/2014 | Ehm et al. | |
| 2015/0036978 A1* | 2/2015 | Sun | G02B 1/12 427/551 |
| 2016/0086681 A1 | 3/2016 | Leung et al. | |
| 2016/0259098 A1* | 9/2016 | Sasai | G02B 5/1852 |
| 2017/0365371 A1 | 12/2017 | Huang et al. | |
| 2019/0101817 A1* | 4/2019 | Lin | G03F 1/54 |
| 2021/0263423 A1 | 8/2021 | Jalics et al. | |

FOREIGN PATENT DOCUMENTS

| | | |
|---|---|---|
| DE | 102011076011 A1 | 11/2012 |
| DE | 102012202850 A1 | 8/2013 |
| DE | 102014204658 A1 | 3/2015 |
| DE | 102015203160 A1 | 9/2015 |
| DE | 102015215014 A1 | 10/2015 |
| DE | 102017222690 A1 | 2/2018 |
| DE | 102018220629 A1 | 6/2020 |
| JP | 2004358924 A | 12/2004 |
| JP | 2011048138 A | 3/2011 |
| JP | 2018511818 A | 4/2018 |
| RU | 2555168 C1 | 7/2015 |
| WO | 2004095086 A2 | 11/2004 |
| WO | 2008034582 A2 | 3/2008 |
| WO | 2009121546 A1 | 10/2009 |
| WO | WO-2010095942 A1 * | 8/2010 ............ B82Y 10/00 |
| WO | 2013113537 A2 | 8/2013 |
| WO | 2013124224 A1 | 8/2013 |
| WO | 2017155049 A1 | 9/2017 |
| WO | 2019025162 A1 | 2/2019 |
| WO | 2019179861 A1 | 9/2019 |
| WO | 2020109225 A2 | 6/2020 |

OTHER PUBLICATIONS

International Preliminary Report on Patentability, PCT/EP2021/069248, Feb. 16, 2023, 8 pages.
German Office Action with English translation, Application No. 10 2020 210 553.7, Mar. 23, 2021, 8 pages.
Japanese Office Action with English translation, Application No. 2023-512235, Mar. 11, 2025, 9 pages.
Japanese Office Action with English translation, Application No. 2023-512235, Jun. 24, 2025, 7 pages.

* cited by examiner

REFLECTIVE OPTICAL ELEMENT, ILLUMINATION OPTICAL UNIT, PROJECTION EXPOSURE APPARATUS, AND METHOD FOR PRODUCING A PROTECTIVE LAYER

CROSS-REFERENCE TO RELATED APPLICATION

This is a Continuation of International Application PCT/EP2021/069248, which has an international filing date of Jul. 12, 2021, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2020 210 553.7 filed on Aug. 20, 2020.

FIELD OF THE INVENTION

The invention relates to a reflective optical element, in particular for an illumination optical unit of a projection exposure apparatus, comprising: a structured surface that preferably forms a grating structure, and a reflective coating applied to the structured surface. The invention also relates to an illumination optical unit for a projection exposure apparatus that includes at least one such reflective optical element, to a projection exposure apparatus comprising such an illumination optical unit, and to a method of forming a protective layer on an optical element.

BACKGROUND

On account of the low transmittance of virtually all known materials to radiation in the extreme ultraviolet (EUV) wavelength range, i.e. at wavelengths between about 5 nm and about 30 nm, both the illumination optical unit and the projection optical unit in a projection exposure apparatus for EUV lithography typically contain exclusively reflective optical elements, in particular in the form of mirrors. The mirrors used therein have a substrate to which a reflective coating is applied in order to reflect the EUV radiation. The reflective coating may be configured as a multilayer coating which acts as an interference layer system for the operating wavelength. If the operating wavelength is about 13.5 nm, the reflective multilayer coating may have, for example, alternating layers of molybdenum and silicon. The reflective coating can be applied directly to the substrate material, but it is also possible for one or more functional layers that serve, for example, to protect the substrate, as polishing layer or as adhesion promoter to be disposed between the reflective coating and the substrate material.

The residual gas present in the vicinity of the reflective optical elements absorbs EUV radiation and hence reduces transmittance as it passes through the projection exposure apparatus. For that reason, projection exposure apparatuses for EUV lithography are typically operated under vacuum conditions. The residual gas present in the vacuum environment may be admixed with small amounts of hydrogen and/or of other reactive gases, e.g. oxygen, which achieve a protective effect or cleaning effect, inter alia, in respect of the reflective optical elements and which have only low absorption for the EUV radiation.

During operation of the projection exposure apparatus, a hydrogen plasma typically forms in such a vacuum environment under the influence of the EUV radiation, meaning that activated hydrogen in the form of hydrogen ions and free hydrogen radicals is formed. The hydrogen ions or free hydrogen radicals cause an etching attack on exposed surfaces of components disposed in the vacuum environment.

The exposed surfaces may, for example, be exposed surface regions of a reflective optical element that may contain silicon, for example, at the surface exposed to the etching attack. The etching attack may result in the formation of volatile substances, for example $SiH_3$, $SiH_4$ (silanes), at the surface, which is associated with the removal of the exposed surfaces and simultaneously with the deposition of the volatile substances on optically utilized surfaces. This results in a loss of reflectivity or degradation of the layer materials used there, up to and including underetching and large-area defects. On penetration of atomic hydrogen into the material of the (partially) exposed surface, for example of a mirror substrate, stresses may additionally occur, which can lead to layer detachment. Atomic hydrogen may additionally penetrate into the exposed material and collect at defects or at interfaces in the form of molecular hydrogen that can no longer escape, which can likewise result in layer detachment. The reflective coating, in particular in the form of twin layers of Mo/Si, can serve as protective layer against penetration of hydrogen in the surface region covered by the reflective coating, provided that the reflective coating is continuous and is not altered by oxidation, for example.

Reflective optical elements, for example in the form of mirrors for illumination optical units of projection exposure apparatuses, may have a structured surface in the form of a grating structure. The grating structure may serve as a spectral filter in order to filter out radiation within a wavelength range which is unwanted and may, for example, be in the infrared or ultraviolet wavelength range. If the reflective coating has been applied to such a structured surface, the problem occurs that any flanks therein are formed with a flank steepness so great that the reflective coating does not fully cover the structured surface on coating, such that gaps occur in the reflective coating where an etching attack can occur in an exposed surface region of the structured surface.

DE 10 2018 220 629 A1 discloses a mirror for an illumination optical unit of a projection exposure apparatus with a spectral filter in the form of a grating structure. The grating structure has a maximum flank steepness in the range from 15° to 60°. The grating structure may be fully covered by a continuous protective layer which has a multitude of twin Si—Mo layers and which forms a reflective coating. The low flank steepness of the grating structure improves the coverage of the grating structure or other structured surface with the protective layer, and in this way increases the hydrogen stability of the reflective optical element.

In the solution described in DE 10 2018 220 629 A1, the problem is that the maximum flank angle of the structured surface or of the grating structure is limited, which results in a loss of reflectivity of the optical element. This loss of reflectivity occurs, for example, on account of scattered light losses in this flank region, since the radiation to be reflected is not reflected here in the directions defined by the optical unit.

WO 2013/113537 A2 discloses a reflective optical element for reflection of EUV radiation, having a substrate on which a multilayer stack formed on at least one surface has a multitude of alternating material layers for reflection of EUV radiation. At the surface, a spectral filter in the form of a three-dimensional profile is formed on a scale much larger than the wavelength of the EUV radiation. The multilayer stack has a stack of coatings that are true to (conform to) the surface, formed on the substrate after the formation of the three-dimensional profile. WO 2013/113537 A2 states that magnetron sputtering, which is typically used for application of multilayer stacks, leads to a high surface roughness of the layers applied in each case. The coating process proposed for application of the multilayer stack is therefore a conformal or isotropic coating process in the form of atomic layer deposition, which produces essentially constant layer thicknesses along the three-dimensional profile. However, the application of a reflective multilayer coating that may have more than 50 twin Mo—Si layers by atomic layer deposition is very complex.

SUMMARY

It is an object of the invention to specify a reflective optical element, an illumination optical unit, a projection exposure apparatus and a method of forming a protective layer, which enable protection of the structured surface from an etching attack in an efficient manner.

This object is achieved by an optical element of the type specified at the outset, in which the reflective coating covers the structured surface discontinuously, and in which the reflective optical element has at least one (additional) protective layer that covers the structured surface continuously.

It is proposed in accordance with the invention, in place of a protective layer in the form of a reflective coating that serves as a continuous protective layer and requires low flank steepness of the structured surface or a complex coating method true to the surface, to apply an additional protective layer that covers the structured surface continuously.

In one embodiment, the structured surface, in particular the grating structure, has a maximum flank steepness of more than 60°, preferably of more than 80°, in particular of more than 90°. The (maximum) flank steepness is measured here relative to a tangent to the (local) surface of the reflective optical element (for example the surface of a substrate), or in the region between two grating webs in the case of a grating structure.

As shown in DE 10 2018 220 629 A1, the reflective coating generally cannot be applied true to the surface in the form of a multilayer coating in the case of such a high flank steepness. On account of the additional protective layer(s) that cover(s) the structured surface continuously, the structured surface may nevertheless be protected efficiently from an etching attack. It is also possible to cover flanks having a flank steepness of more than 90°, i.e. an underetched flank, as can be formed, for example, in wet chemical etching.

In a further embodiment, the protective layer has a thickness of, for example, 100 nm or less, preferably of 10 nm or less, more preferably of 5 nm or less. In order to produce a continuous protective layer at the flank steepness described above, it is typically necessary to apply it by a comparatively complex isotropic coating method. For the protection of the structured surface from an etching attack, however, all that is required is a comparatively low thickness of the protective layer. The reflective coating, which generally has a much greater thickness, may be applied, by contrast, by a non-isotropic coating method. Such a coating method is less complex, but has the effect that the reflective coating does not cover the structured surface continuously.

In a further embodiment, the coating forms a multilayer coating for reflection of EUV radiation. Such a multilayer coating typically has a multitude of alternating layers of a material having a high refractive index at the operating wavelength and a material having a low refractive index at the operating wavelength. The materials may, for example, be silicon and molybdenum, but other material combinations are possible depending on the operating wavelength.

In a further embodiment, the protective layer is formed between the structured surface and the reflective coating. The application of the protective layer beneath the reflective coating is favorable since, in this case, the protective layer does not cause any loss of reflectivity. It is optionally also possible for the protective layer itself to be structured, for example in order to produce a grating substructure or further structuring of the grating structure beneath the protective layer.

In a further embodiment, a cap layer is applied to the reflective coating. The cap layer serves to protect the underlying layers of the reflective coating from further environmental influences, for example from oxidation or from tin contamination which is generated by an EUV radiation source. It is also possible to choose the material of the protective layer such that contamination, in particular in the form of tin contamination, can optionally be removed from the surface of the cap layer. The cap layer generally does not cover the structured surface continuously like the reflective coating, and is typically applied by a non-isotropic coating method.

In a further embodiment, the cap layer forms the protective layer that fully covers the structured surface. In this embodiment, the cap layer is typically applied by an isotropic coating method and forms an overcoat which also covers the (possibly steep) flanks of the structured surface or of the grating structure continuously. The protective layer in the form of the cap layer may optionally be combined with a further protective layer which, as described above, is disposed between the reflective coating and the structured surface. As is customary in the case of cap layers, the material of the protective layer or cap layer absorbs a portion of the EUV radiation and therefore reduces the reflectivity of the reflective optical element. The cap layer may form a single layer, but it is also possible that the cap layer itself forms a multilayer coating having two or more layers of different materials.

In a further embodiment, the structured surface is formed in a functional layer applied to a substrate and/or in the substrate. The functional layer is typically easy to process (for example by material removal, polishing, structuring by etching, etc.). It will be apparent that other functional layers may also be applied to the substrate in addition to the functional layer which is processed to form the structured surface. For example, this may comprise one or more layers that enable processing to the shape of the figure of the reflective optical element, for example by material removal, polishing, etc. The functional layer may also be an adhesion promoter layer or the like. The substrate of the reflective optical element, which has a much greater thickness than the functional layer(s), may also have the structured surface. It is also possible that the structured surface is formed partly in the functional layer and partly in the substrate.

In a further embodiment, the substrate and/or the functional layer includes at least one material selected from the group comprising: amorphous silicon (aSi), silicon (Si), nickel-phosphorus (Ni:P), metals, in particular from the group of titanium (Ti), platinum (Pt), gold (Au), aluminum (Al), nickel (Ni), copper (Cu), silver (Ag), tantalum (Ta), tungsten (W) and alloys thereof, oxides, in particular from the group of silicon dioxide ($SiO_2$), aluminum oxide ($AlO_x$), titanium oxide ($TiO_x$), tantalum oxide ($TaO_x$), niobium oxide ($NbO_x$), zirconium oxide ($ZrO_x$) and combinations thereof (for example mixed oxides, ceramics, glasses, glass ceramics, composite materials). As described in DE 10 2018

220 629 A1 that was cited at the outset, these materials have been found to be useful in particular for the components of an EUV projection exposure apparatus.

In a further embodiment, the protective layer includes at least one material selected from the group comprising: metals, in particular copper (Cu), cobalt (Co), platinum (Pt), iridium (Ir), palladium (Pd), ruthenium (Ru), gold (Au), tungsten (W), etc. and alloys thereof, oxides, in particular aluminum oxide ($AlO_x$), zirconium oxide ($ZrO_x$), titanium oxide ($TiO_x$), niobium oxide ($NbO_x$), tantalum oxide ($TaO_x$), hafnium oxide ($HfO_x$), chromium oxide ($CrO_x$), carbides, borides, nitrides, silicides and combinations thereof (e.g. mixed oxides, ceramics, glasses, glass ceramics, composite materials). The protective layer may be formed from a single layer, but it is also possible that the protective layer itself forms a multilayer coating having two or more layers of different materials.

The material(s) of the protective layer must meet several demands: Firstly, the protective layer shall very substantially prevent the diffusion of molecular hydrogen ($H_2$), of hydrogen ions ($H^+$) and of free hydrogen radicals ($H^*$) through the (thin) protective layer. Secondly, the protective layer or material thereof shall not enter into any chemical reaction with $H_2$, $H^+$, $H^*$, and with tin. The protective layer shall also have high thermal stability and high reduction and oxidation stability, high EUV resistance and high resistance to cleaning processes, in particular for the removal of deposits as a result of operation in the system (e.g. tin).

In particular if the protective layer is applied beneath the reflective coating, the protective layer should not cause any deterioration in the roughness of the substrate or functional layer to which it is applied. It is also favorable when the protective layer, in what is called a refurbishment process in which an old coating is removed and replaced by a new coating, can be removed in a comparatively simple manner or is not attacked or disadvantageously roughened by such a process. The materials specified above meet most of the above-described demands.

In a further embodiment, the reflective optical element takes the form of a collector mirror for an illumination optical unit of a projection exposure apparatus. Such a collector mirror may have, for example, one or more ellipsoidal and/or hyperboloid reflection surfaces corresponding to the surface having the reflective coating. Illumination radiation may be incident on the reflection surface of the collector mirror with grazing incidence (GI), i.e. at angles of incidence of greater than 45°, or with normal incidence (NI), i.e. at angles of incidence of less than 45°.

The collector mirror typically has a structured surface in the form of a grating structure which serves as a spectral filter in order to suppress extraneous light, i.e. radiation at wavelengths outside the EUV wavelength range, for example in the infrared or ultraviolet wavelength range. It will be apparent that the reflective optical element need not necessarily take the form of a collector mirror, but may also be any other reflective optical element having a structured surface.

One aspect of the invention relates to an illumination optical unit for a projection exposure apparatus, comprising: at least one reflective optical element as described above. The reflective optical element may, for example, be the collector mirror described above.

A further aspect of the invention relates to a projection exposure apparatus for microlithography, in particular for EUV lithography, comprising: an illumination optical unit as described above for transfer of illumination radiation from a radiation source onto a reticle comprising structures to be imaged, and a projection optical unit for imaging the structures of the reticle on a wafer.

In a further aspect, the invention also relates to a method of forming a protective layer on a reflective optical element as described above, said method comprising: applying the protective layer to the structured surface or to the reflective coating through an isotropic coating method.

As described above, with the aid of an isotropic coating method, even in the case of a structured surface having flanks with high flank steepness, it is possible to apply a continuous protective layer. By contrast, the reflective coating can be applied with the aid of a non-isotropic coating method, for example by a PVD coating method such as magnetron sputtering. The use of a non-isotropic coating method for application of the reflective coating is advantageous since this generally has a (much) greater thickness than the protective layer.

In one variant, the isotropic coating method is selected from the group comprising: chemical vapor deposition (CVD), in particular atomic layer deposition (ALD), or physical vapor deposition (PVD). If the coating is applied by PVD, a specific directed geometry is typically required, which reduces the actual anisotropy of these methods. It is possible here to combine multiple material sources which may, for example, be in a tilted arrangement. In this case, the coating rates can be controlled by shadowing, which suppresses particular angles of incidence. In addition, a tilt or pivoting motion of the mirror to be coated is possible.

The isotropic coating methods used for the application of the protective layer may be conducted at comparatively low temperatures and hence enable protection of the substrate. The isotropic coating methods additionally enable application of a protective layer with a homogeneous degree of coverage, i.e. with an essentially constant thickness, even with the high flank steepness on the structured surface as described above. The above-described isotropic coating methods also enable the deposition of the protective layer with comparatively low roughness. This is favorable in particular in the case that the protective layer is formed between the structured surface and the reflective coating.

Further features and advantages of the invention will be apparent from the description of working examples of the invention that follows, with reference to the figures of the drawing, which show details essential to the invention, and from the claims. The individual features can each be implemented alone or in a plurality in any combination in one variant of the invention.

BRIEF DESCRIPTION OF THE DRAWINGS

Working examples are shown in the schematic drawing and are detailed in the description which follows. The figures show.

DETAILED DESCRIPTION

Figure 1:
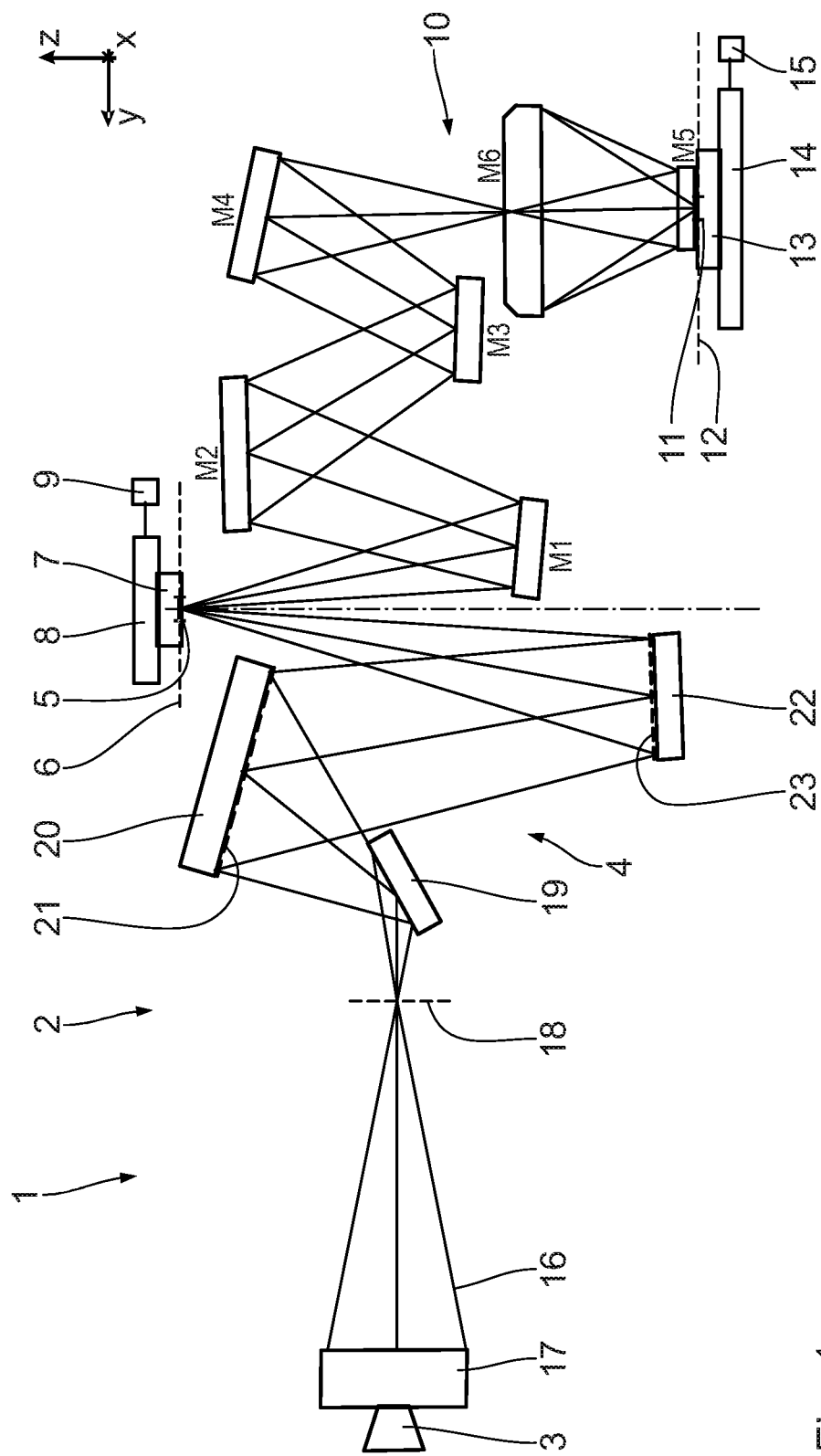
FIG. 1 a schematic in meridional section of a projection exposure apparatus for EUV lithography.

In the description of the drawings that follows, identical reference signs are used for components that are the same or have the same function, or are analogous or have analogous function.

The salient constituents of a projection exposure apparatus 1 of microlithography are described hereinafter by way of example with reference to FIG. 1. The description of the basic setup of the projection exposure apparatus 1 and constituents thereof should not be considered here to be restrictive.

An illumination system 2 of the projection exposure apparatus 1, as well as a radiation source 3, has an illumination optical unit 4 for illumination of an object field 5 in an object plane 6. What is exposed here is a reticle 7 disposed in the object field 5. The reticle 7 is held by a reticle holder 8. The reticle holder 8 is displaceable by way of a reticle displacement drive 9, in particular in a scanning direction.

For purposes of description, a Cartesian xyz coordinate system is shown in FIG. 1. The x direction runs perpendicularly to the plane of the drawing. The y direction runs horizontally, and the z direction runs vertically. The scanning direction runs in the y direction in FIG. 1. The z direction runs perpendicularly to the object plane 6.

The projection exposure apparatus 1 comprises a projection optical unit 10. The projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, in particular in the y direction. The displacement of the reticle 7 on the one hand by way of the reticle displacement drive 9 and of the wafer 13 on the other hand by way of the wafer displacement drive 15 may be synchronized with one another.

The radiation source 3 is an EUV radiation source. The radiation source 3 emits EUV radiation 16 in particular, which is also referred to below as used radiation or illumination radiation. In particular, the used radiation has a wavelength in the range of between 5 nm and 30 nm. The radiation source 3 may be a plasma source, for example an LPP ("laser produced plasma") source or a GDPP ("gas discharged produced plasma") source. It may also be a synchrotron-based radiation source. The radiation source 3 may be a free electron laser (FEL).

The illumination radiation 16 emanating from the radiation source 3 is focused by a collector mirror 17. The collector mirror 17 may be a collector mirror with one or more ellipsoidal and/or hyperboloidal reflection surfaces. The illumination radiation 16 may be incident on the at least one reflection surface of the collector mirror 17 with grazing incidence (GI), i.e. at angles of incidence of greater than 45°, or with normal incidence (NI), i.e. at angles of incidence of less than 45°. The collector mirror 17 may be structured and/or coated, firstly to optimize its reflectivity for the used radiation and secondly to suppress extraneous light.

The illumination radiation 16 propagates through an intermediate focus in an intermediate focal plane 18 downstream of the collector mirror 17. The intermediate focal plane 18 may constitute a separation between a radiation source module, having the radiation source 3 and the collector mirror 17, and the illumination optical unit 4.

The illumination optical unit 4 comprises a deflection mirror 19 and, arranged downstream thereof in the beam path, a first facet mirror 20. The first facet mirror 20 comprises a multiplicity of individual first facets 21, which are also referred to as field facets below. FIG. 1 depicts only some of these facets 21 by way of example. In the beam path of the illumination optical unit 4, a second facet mirror 22 is arranged downstream of the first facet mirror 20. The second facet mirror 22 comprises a plurality of second facets 23.

The illumination optical unit 4 consequently forms a doubly faceted system. This basic principle is also referred to as fly's eye integrator. With the aid of the second facet mirror 22, the individual first facets 21 are imaged into the object field 5. The second facet mirror 22 is the last beam-shaping mirror or actually the last mirror for the illumination radiation 16 in the beam path upstream of the object field 5.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a passage opening for the illumination radiation 16. The projection optical unit 10 is a double-obscured optical unit. The projection optical unit 10 has an image-side numerical aperture which is greater than 0.5 and which may also be greater than 0.6 and, for example, can be 0.7 or 0.75.

Just like the mirrors of the illumination optical unit 4, the mirrors Mi may have highly reflective coatings for the illumination radiation 16. The collector mirror 17 of the illumination optical unit 4, in order to suppress extraneous light, has a structured surface 25a that forms a grating structure 29. The grating structure 29 serves as a spectral filter in order to filter extraneous light in a predefined wavelength range, for example in the IR wavelength range.

Figure 2:
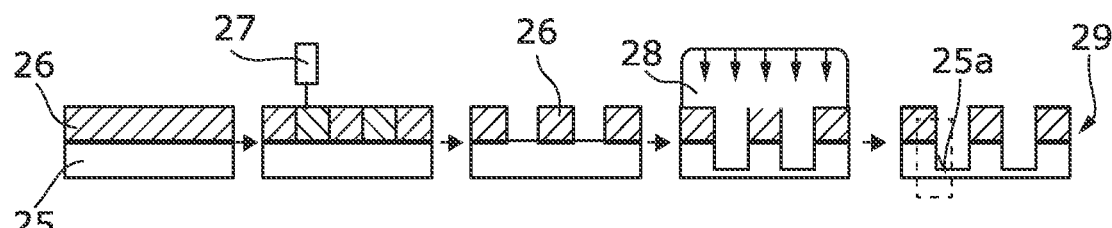
FIG. 2 a schematic diagram of a process sequence in the production of a structured surface that forms a grating structure, FIGS. 3A and 3B schematic diagrams of a detail of the structured surface of FIG. 2 with grating flanks having different flank steepnesses (90° and >90°, respectively), FIGS. 4A and 4B schematic diagrams analogously to FIGS. 3A and 3B, respectively, with a reflective coating applied to the structured surface that covers the structured surface in a noncontinuous manner, FIGS. 5A and 5B schematic diagrams analogously to FIGS. 3A and 3B, respectively, with a protective layer which is formed between the grating structure and the reflective coating and covers the grating structure in a continuous manner, FIG. 6 a schematic diagram analogously to FIG. 5A, in which the protective layer is applied to the reflective coating and covers the grating structure in a continuous manner, and FIG. 7 a schematic diagram analogously to FIG. 5A, in which a cap layer that covers the grating structure in a non-continuous manner is applied to the reflective coating.

FIG. 2 shows a schematic of an example of a process procedure in the production of the structured surface 25a, formed in a functional layer 25 of the collector mirror 17 that can be structured by etching. For the structuring, a structuring layer 26 in the form of a photoresist is first applied over the area of the functional layer 25. The structuring layer 26 is selectively exposed in a subsequent step with the aid of a laser 27. In a further step, the exposed part of the structuring layer 26 is removed. The structuring layer 26 can also be structured in a different way than by irradiation with a laser 27. For example, the structuring layer 26 may be exposed in a lithography process.

In a subsequent etching step, the functional layer 25 is selectively etched using the structuring layer 26 as etching mask, with formation of the structured surface 25a on the functional layer 25. The structured surface 25a forms the grating structure 29, the geometry of which is chosen such that it serves as spectral filter and suppresses extraneous light at wavelengths in a respectively defined wavelength range.

The functional layer 25 can be structured with the aid of a dry etching method or with the aid of a wet-chemical etching method. For details of this etching method, reference is made to DE 10 2018 220 629 A1, which is mentioned in the introduction and which is incorporated into this application in its entirety by reference.

Figure 3A:
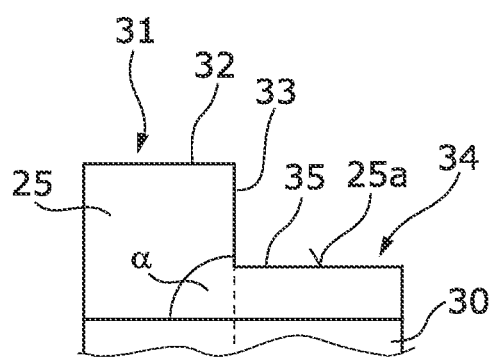

FIG. 3A shows a detail, represented by a dotted line in FIG. 2, of the structured surface 25a after the removal of the structuring layer 26. The structured surface 25a or the grating structure 29 has a multitude of grating webs 31, each comprising a top face 32 and flanks 33. Grooves 34 having a base 35 are formed in each case between the grating webs 31. The structured functional layer 25 with the grating structure 29 is formed on a substrate 30 of the collector mirror 17.

By contrast with what is shown in FIG. 2 and FIG. 3A, the structured surface 25a may also be formed in the substrate 30, or the structured surface 25 may be formed partly in the functional layer 25 and partly in the substrate 30, as described in DE 10 2018 220 629 A1.

The functional layer 25 or substrate 30 includes at least one material that has good processibility or good structurability by etching. The material of the functional layer 25 or substrate 30 may, for example, be amorphous silicon (aSi), silicon (Si), nickel-phosphorus, metals, in particular from the group of titanium (Ti), platinum (Pt), gold (Au), aluminum (Al), nickel (Ni), copper (Cu), silver (Ag), tantalum (Ta), tungsten (W) and alloys thereof, oxides, in particular from the group of silicon dioxide ($SiO_2$), aluminum oxide ($AlO_x$), titanium oxide ($TiO_x$), tantalum oxide ($TaO_x$), niobium oxide ($NbO_x$), zirconium oxide ($ZrO_x$) and combinations thereof (for example mixed oxides, ceramics, glasses, glass ceramics, composite materials).

The grating webs 31 shown in FIG. 3A each have flanks 33 having a flank steepness a of 90°. The flank steepness a is measured in relation to a local tangential plane corresponding to the top face of the substrate 30. In an equivalent manner thereto, the flank steepness a of the flank 33 may also be measured against a tangential plane corresponding to the base 35 of the groove 34 adjacent to the flank 33. The flank steepness a is measured against a local tangential plane since the surface of the substrate 30 or of the collector mirror 17 is not planar, but rather has a generally ellipsoidal and/or hyperboloid geometry, as described above.

Figure 3B:
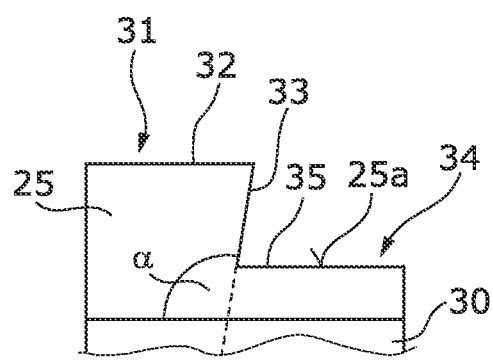
Figure 4A:
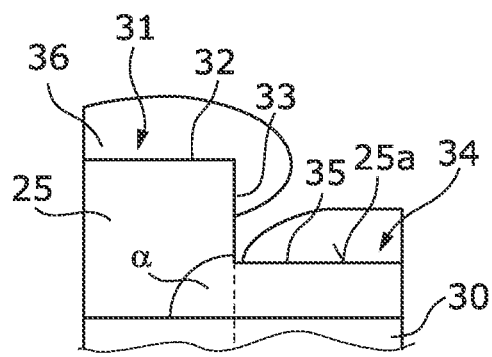
Figure 4B:
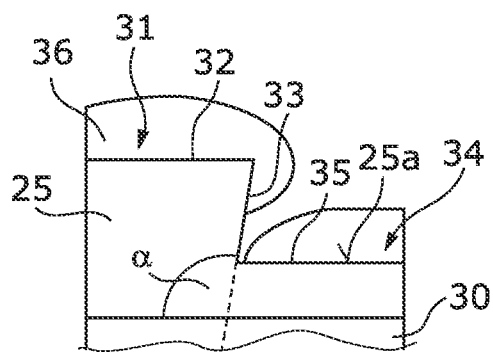

FIG. 3B shows a case in which the flank steepness a is more than 90°, i.e. forms an undercut in the flank 33. Such a flank 33 with an undercut may be produced, for example, in (directed) wet-chemical etching.

In the case of the steep flanks 33 shown in FIGS. 3A and 3B, or in the case of a (maximum) flank steepness a typically more than about 60°, in the case of application of a reflective coating 36 to the structured surface 25a by a conventional coating method, for example by magnetron sputtering, it is not possible to achieve continuous coverage of the structured surface 25a. Instead, there will be gaps in the coverage as a result of the reflective coating 36 in the region of the flanks 33. Subregions of the structured surface 25a are thus exposed and, as described above, are subject to an etching attack by molecular hydrogen, by free hydrogen radicals and by hydrogen ions and/or to the above-described degradations, for example oxidation. If the material of the functional layer 25 includes silicon, such an etching attack forms silanes (e.g. $SiH_3$, $SiH_4$), which are deposited on optically utilized surfaces, which can lead to a loss of reflectivity or to degradation of the layer materials used there, possibly to the extent of under-etching and large-area defects.

Figure 5A:
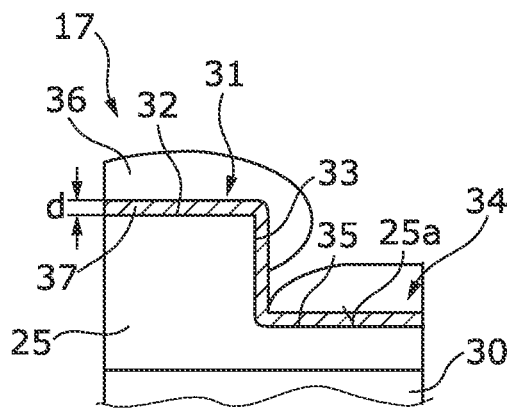
Figure 5B:
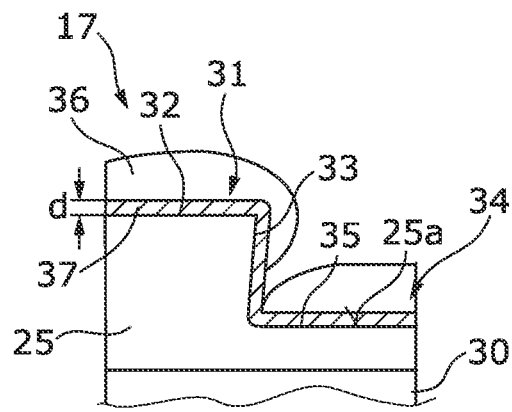

In order to protect the functional layer 25 from the etching attack by reactive hydrogen, in the examples shown in FIGS. 5A and 5B, a protective layer 37 is formed between the structured surface 25a and the reflective coating 36. By contrast with the reflective coating 36, the protective layer 37 covers the structured surface 25a continuously, i.e. over the full area and without gaps, in the region of the flanks 33.

In order to achieve continuous coverage of the structured surface 25a by the protective layer 37, the protective layer 37 is applied or deposited by an isotropic coating method. The isotropic coating method in the example shown is atomic layer deposition, but it is also possible to use another isotropic CVD coating method or a PVD coating method with a suitably selected directed geometry for this purpose, which reduces the anisotropy that typically exists in the PVD method. It is possible, for example, to combine multiple material sources which may, for example, be in a tilted arrangement. In this case, the coating rates can be controlled by shadowing, which suppresses particular angles of incidence. In addition, a tilt or pivoting motion of the optical element 17 to be coated is possible.

The thickness d of the protective layer 37 in the example shown is about 5 nm and generally does not exceed a thickness of 100 nm. On account of the comparatively low thickness of the protective layer 37 and on account of the somewhat lower demands on control of layer thickness compared to the reflective coating 36, the isotropic coating method may be conducted with a comparatively manageable degree of complexity.

The reflective coating 36 is a multilayer coating for reflection of the EUV radiation 16, having a multitude of twin layers formed from molybdenum and silicon. The number of twin layers may be in the order of magnitude of, for example, 30 to 80, but may also be greater or smaller. Correspondingly, the reflective multilayer coating 36 has a considerable thickness. The applying of the reflective multilayer coating 35 with an isotropic coating method, for example by atomic layer deposition, would therefore be very complex.

The protective layer 37 may have a single layer, but it is also possible that the protective layer 37, like the reflective coating 36, has multiple layers of different materials. In principle, the material(s) of the protective layer 37 should as far as possible prevent the diffusion of molecular hydrogen, of hydrogen ions and hydrogen radicals through the protective layer 37, and also not enter into any chemical reaction with these hydrogen species and with other contaminating substances, for example tin. For this purpose, the protective layer 37 typically includes at least one material selected from the group comprising: metals, in particular from the group of copper (Cu), cobalt (Co), platinum (Pt), iridium (Ir), palladium (Pd), ruthenium (Ru), gold (Au), tungsten (W), and alloys thereof, oxides, in particular from the group of aluminum oxide ($AlO_x$), zirconium oxide ($ZrO_x$), titanium oxide ($TiO_x$), niobium oxide ($NbO_x$), tantalum oxide ($TaO_x$), hafnium oxide ($HfO_x$), chromium oxide ($CrO_x$), carbides, borides, nitrides, silicides and combinations thereof (for example mixed oxides, ceramics, glasses, glass ceramics, composite materials).

In particular if the protective layer 37 is formed between the structured surface 25a and the reflective coating 36, it is favorable when the protective layer 37 has low roughness.

Figure 6:
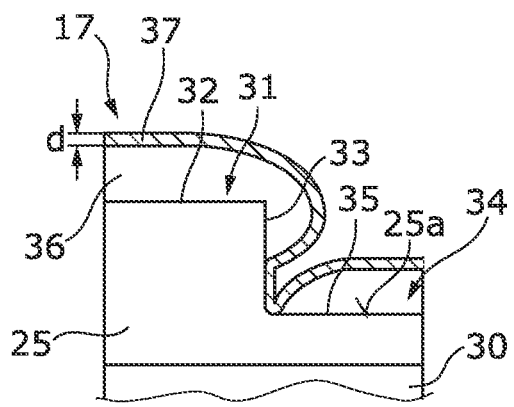

FIG. 6 shows a collector mirror 17 in which the protective layer 37 forms a cap layer applied to the reflective multilayer coating 36 with the aid of an isotropic coating method. The protective layer 37 in this case fully and continuously covers both the reflective coating 36 and a subregion of the structured surface 25a which is not covered by the reflective coating 36. In the example shown in FIG. 6, the protective layer 37 likewise has a low thickness d of less than about 10 nm and is formed from a material or a combination of materials having a comparatively low absorption for EUV radiation 16. In this way, it is possible to ensure that the protective layer 37 does not excessively reduce the reflectivity of the collector mirror 17.

Figure 7:
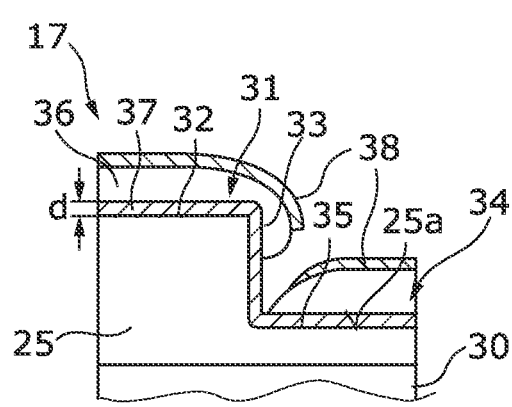

FIG. 7 shows an example of a collector mirror 17 in which the protective layer 37, as in FIGS. 5A and 5B, is formed between the structured surface 25a and the reflective coating 36. In addition, a cap layer 38 is applied to the reflective coating 36. By contrast with FIG. 6, the cap layer shown in FIG. 7 does not form a complete protective layer since it does not cover the structured surface 25a continuously, but rather has gaps, as is also the case for the reflective coating 36. The cap layer 38 may be formed, for example, from one of the materials described above in connection with the protective layer 37. In principle, in the examples shown in FIGS. 5A and 5B as well, a cap layer 38 may be applied to the reflective coating 36. The cap layer 38 may be applied by an isotropic coating method, as shown in FIG. 6, or by an anisotropic coating method, as shown in FIG. 7.

The protective layer 37 may be applied not only in the case of the collector mirror 17 but also in the case of other structured reflective optical elements of the projection exposure apparatus 1, in order to protect these from the etching attack of a hydrogen plasma. It is also possible to use the protective layer in reflective optical elements designed to reflect radiation at different wavelengths than the EUV wavelength range. The protective layer 37 may also serve to protect the structured surface 25a from an etching attack by chemical elements other than hydrogen. In this case, the materials from which the protective layer 37 is formed should be matched to the chemical elements from which the structured surface 25a is to be protected.

What is claimed is:

1. A reflective optical element configured as a collector mirror for an illumination optical unit of a projection exposure apparatus, comprising:
    a structured surface, and
    a reflective coating applied to the structured surface, wherein
    the reflective coating covers the structured surface discontinuously, and
    the reflective optical element has at least one protective layer that covers the structured surface continuously, wherein the structured surface forms a grating structure having a maximum flank steepness of more than 80°.

2. The reflective optical element as claimed in claim 1, wherein the grating structure has a maximum flank steepness (a) of more than 90°.

3. The reflective optical element as claimed in claim 1, wherein the protective layer has a thickness (d) of 100 nm or less.

4. The reflective optical element as claimed in claim 3, wherein the protective layer has a thickness (d) of 5 nm or less.

5. The reflective optical element as claimed in claim 1, wherein the reflective coating forms a multilayer coating for reflection of extreme ultraviolet radiation.

6. The reflective optical element as claimed in claim 1, wherein the protective layer is formed between the structured surface and the reflective coating.

7. The reflective optical element as claimed in claim 1, further comprising a cap layer applied to the reflective coating.

8. The reflective optical element as claimed in claim 7, wherein the protective layer forms the cap layer that fully covers the structured surface.

9. The reflective optical element as claimed in claim 1, wherein the structured surface is formed in a functional layer applied to a substrate and/or in the substrate.

10. The reflective optical element as claimed in claim 9, wherein the functional layer and/or the substrate includes at least one material selected from the group consisting essentially of: amorphous silicon (aSi), silicon (Si), nickel-phosphorus (Ni:P), metals, alloys thereof, oxides, and combinations thereof.

11. The reflective optical element as claimed in claim 10, wherein the functional layer and/or the substrate includes at least one material selected from the group consisting essentially of: titanium (Ti), platinum (Pt), gold (Au), aluminum (Al), nickel (Ni), copper (Cu), silver (Ag), tantalum (Ta), tungsten (W), silicon dioxide ($SiO_2$), aluminum oxide ($AlO_x$), titanium oxide ($TiO_x$), tantalum oxide ($TaO_x$), niobium oxide ($NbO_x$), zirconium oxide ($ZrO_x$), mixed oxides, ceramics, glasses, glass ceramics, and composite materials.

12. The reflective optical element as claimed in claim 1, wherein the protective layer includes at least one material selected from the group consisting essentially of: metals and alloys thereof, oxides, carbides, carbonitrides, borides, nitrides, silicides and combinations thereof.

13. The reflective optical element as claimed in claim 12, wherein the protective layer includes at least one material selected from the group consisting essentially of: copper (Cu), cobalt (Co), platinum (Pt), iridium (Ir), palladium (Pd), ruthenium (Ru), gold (Au), tungsten (W), alloys thereof, oxides, carbides, carbonitrides, borides, nitrides, silicides and combinations thereof.

14. The reflective optical element as claimed in claim 13, wherein the oxides are selected from the group consisting essentially of: aluminum oxide ($AlO_x$), zirconium oxide ($ZrO_x$), titanium oxide ($TiO_x$), niobium oxide ($NbO_x$), tantalum oxide ($TaO_x$), hafnium oxide ($HfO_x$), and chromium oxide ($CrO_x$), mixed oxides, ceramics, glasses, glass ceramics, and composite materials.

15. An illumination optical unit for a projection exposure apparatus, comprising: at least one reflective optical element as claimed in claim 1.

16. A projection exposure apparatus for microlithography, comprising:
    an illumination optical unit as claimed in claim 15 and configured to transfer illumination radiation from a radiation source onto a reticle comprising structures to be imaged, and
    a projection optical unit configured to image the structures of the reticle onto a wafer.

17. A method, comprising:
    providing a reflective optical element as claimed in claim 1, and
    forming the protective layer on the reflective optical element by applying the protective layer to the structured surface or to the reflective coating with an isotropic coating method.

18. The method as claimed in claim 17, wherein the isotropic coating method is selected from the group consisting essentially of: chemical vapor deposition and physical vapor deposition.

19. The method as claimed in claim 18, wherein the isotropic coating method is selected from the group consisting essentially of: atomic layer deposition and physical vapor deposition.

20. The method as claimed in claim 17, further comprising applying the reflective coating to the structured surface with a non-isotropic coating method.

* * * * *